(12) United States Patent
Crockett et al.

(10) Patent No.: US 12,290,011 B2
(45) Date of Patent: Apr. 29, 2025

(54) MULTI-BIT STORAGE DEVICE USING PHASE CHANGE MATERIAL

(71) Applicant: Toshiba Global Commerce Solutions, Inc., Durham, NC (US)

(72) Inventors: Timothy Crockett, Raleigh, NC (US); Lester Bartus, Jr., Wake Forest, NC (US)

(73) Assignee: Toshiba Global Commerce Solutions, Inc., Durham, NC (US)

( * ) Notice: Subject to any disclaimer, the term of this patent is extended or adjusted under 35 U.S.C. 154(b) by 0 days.

(21) Appl. No.: 18/653,418

(22) Filed: May 2, 2024

(65) Prior Publication Data

US 2024/0292764 A1 Aug. 29, 2024

Related U.S. Application Data

(62) Division of application No. 17/810,688, filed on Jul. 5, 2022, now Pat. No. 12,004,433.

(51) Int. Cl.
| | |
|---|---|
| *H10N 70/00* | (2023.01) |
| *G11C 13/00* | (2006.01) |
| *H10B 63/00* | (2023.01) |
| *H10N 70/20* | (2023.01) |

(52) U.S. Cl.
CPC ....... *H10N 70/826* (2023.02); *G11C 13/0004* (2013.01); *G11C 13/0038* (2013.01); *H10B 63/20* (2023.02); *H10N 70/231* (2023.02); *H10N 70/8413* (2023.02); *H10N 70/8828* (2023.02); *G11C 2013/009* (2013.01)

(58) Field of Classification Search
CPC ............... H10N 70/826; H10N 70/231; H10N 70/8413; H10N 70/8828; H10N 70/253; G11C 13/0004; G11C 13/0038; G11C 2013/009; G11C 13/0069; G11C 2213/79; H10B 63/20
See application file for complete search history.

(56) References Cited

U.S. PATENT DOCUMENTS

| | | | | |
|---|---|---|---|---|
| 7,964,468 | B2 | 6/2011 | Lung et al. | |
| 11,690,305 | B2 | 6/2023 | Cheng et al. | |
| 2006/0278895 | A1 | 12/2006 | Burr et al. | |
| 2008/0007995 | A1* | 1/2008 | Schwerin | ............... H10B 63/30 365/158 |
| 2022/0173316 | A1 | 6/2022 | Yang et al. | |
| 2023/0075622 | A1 | 3/2023 | Ok et al. | |

* cited by examiner

*Primary Examiner* — Jerome Leboeuf
(74) *Attorney, Agent, or Firm* — Stanek Lemon Crouse & Meeks PA

(57) ABSTRACT

A non-volatile multi-bit storage device that includes a phase change material doped with n-type or p-type semiconductor impurities, a first set of electrodes ohmically coupled to the phase change material, a second set of electrodes configured to apply an electric field across the phase change material. To program the non-volatile multi-bit storage device, an electrical field is applied to the phase change material as crystal annealing cool down is performed. Application of the electric field during the crystal annealing cool down forms a rectified current path through the phase change material.

20 Claims, 10 Drawing Sheets

(Prior Art)

(Prior Art)

MULTI-BIT STORAGE DEVICE USING PHASE CHANGE MATERIAL

RELATED APPLICATIONS

The present application claims priority benefit to U.S. patent application Ser. No. 17/810,688, entitled "Multi-Bit Storage Device Using Phase Change Material," filed Jul. 5, 2022, which is hereby incorporated herein by reference in its entirety.

BACKGROUND

A phase change memory device has a nonvolatile property of maintaining stored data when its power supply is interrupted. A unit cell of the phase change memory device uses a phase change material as a data storing medium. The phase change material has two stable states, namely, an amorphous state and a crystalline state, which is controlled by heat provided to the cell structure by an applied current. A generally-known phase change, or chalcogenide, material is a compound of Ge, Sb and Te, commonly referred to as a GST material (Ge—Sb—Te). One type of GST material is $Ge_2Sb_2Te_5$.

DETAILED DESCRIPTION

Figure 1:
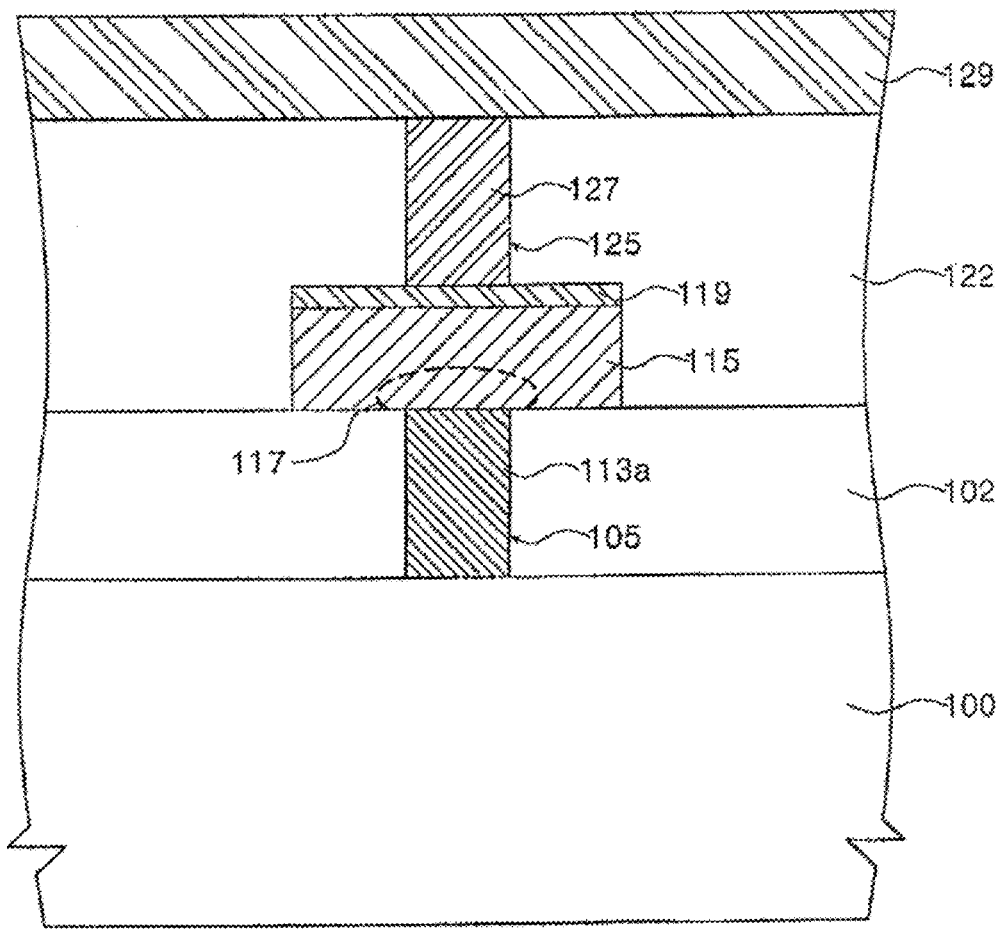
FIG. 1 is a cross-sectional diagram illustrating the structure of a conventional phase change memory cell.

Although certain embodiments and examples are described herein, it will be understood that the disclosure extends beyond the specifically disclosed embodiments and/or uses and obvious modifications and equivalents thereof. Thus, it is intended that the scope of the disclosure herein disclosed should not be limited by any particular embodiments described below.

At least one example embodiment will now be described more fully with reference to the accompanying drawings, in which at least one example embodiment is shown. At least one example embodiment may, however, be embodied in many different forms and should not be construed as limited to the at least one example embodiment set forth herein. In the drawings, the thicknesses of layers and regions may be exaggerated for clarity. Like reference numerals in the drawings denote like elements, and thus their description may be omitted.

At least one example embodiment may be described herein with reference to cross-sectional or side view illustrations that are schematic illustrations of idealized one or more example embodiments (and intermediate structures). As such, variations from the shapes of the illustrations as a result, for example, of manufacturing techniques and/or tolerances, are to be expected. These examples should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When the GST material is heated for a short time at a temperature close to a melting point of the material and is then quickly cooled or quenched, the GST material is in its amorphous state. If the GST is heated for a long time at a crystallization temperature lower than the melting point and slowly cooled, the GST is in its crystalline state. The amorphous GST has a higher specific resistance than the crystalline GST.

Therefore, whether the information stored in the phase change memory cell is logical '1' or '0' can be determined by sensing an amount of current flowing through the phase change material.

Joule heat is used as the heat supplied to the phase change material. That is, when the current is supplied to an electrode connected to the phase change material, Joule heat is generated from the electrode and supplied to the phase change material. The temperature of the heat supplied to the phase change material is dependent upon the amount of the supplied current.

FIG. 1 is a cross-sectional diagram illustrating the structure of a conventional phase change memory cell. Referring to FIG. 1, a lower insulating layer 102 is formed on a semiconductor substrate. An upper insulating layer 122 is formed on the lower insulating layer 102. A first contact hole 105 is formed through the lower insulating layer 102, and a second contact hole 125 is formed in the upper insulating layer 122. The second contact hole 125 includes a conductive upper or top contact plug 127 made of a conductive material such as tungsten (W), aluminum (Al) or copper (Cu). The first contact hole 105 includes a conductive lower or bottom contact plug and heater 113*a* made of a conductive material such as Tian, TiN, or like material.

A layer of chalcogenide GST phase change material 115 is formed in the upper insulating layer 122 on the lower insulating layer 102. A conductive upper electrode 119, made of a material such as TiN, TaN, WN or similar material, is formed on the top surface of the GST phase change material 115. The phase change material 115 is electrically connected at its bottom surface to the lower plug or heater 113a and is electrically connected at its top surface to the upper electrode 119 and the upper contact plug 127. A conductive metal pattern 129, made of a conductive material such as W, Al, Cu, or similar material, is connected to the upper contact plug 127 and the upper electrode 119.

When the memory cell is programmed (sometimes referred to as a write operation), a current is applied to the structure between the metal pattern 129 and the bottom contact and heater 113a. As the current passes through the heater 113a, the resulting heat affects the state of the GST material 115 in a programmable volume or region 117. Depending on the programming process applied, the GST material in the programmable volume 117 takes on a crystalline state or an amorphous state. For example, to program the programmable volume to the crystalline state, the GST material can be heated to approximately 150 degrees C. by passing a current of approximately 0.56 mA through the material and allowing it to cool for approximately 500 ns. For example, to program the programmable volume to the amorphous state, the GST material can be heated to approximately 620 degrees C. by passing a current of approximately 1.2 mA through the material and allowing it to cool for approximately 4-5 ns.

Figure 2A:
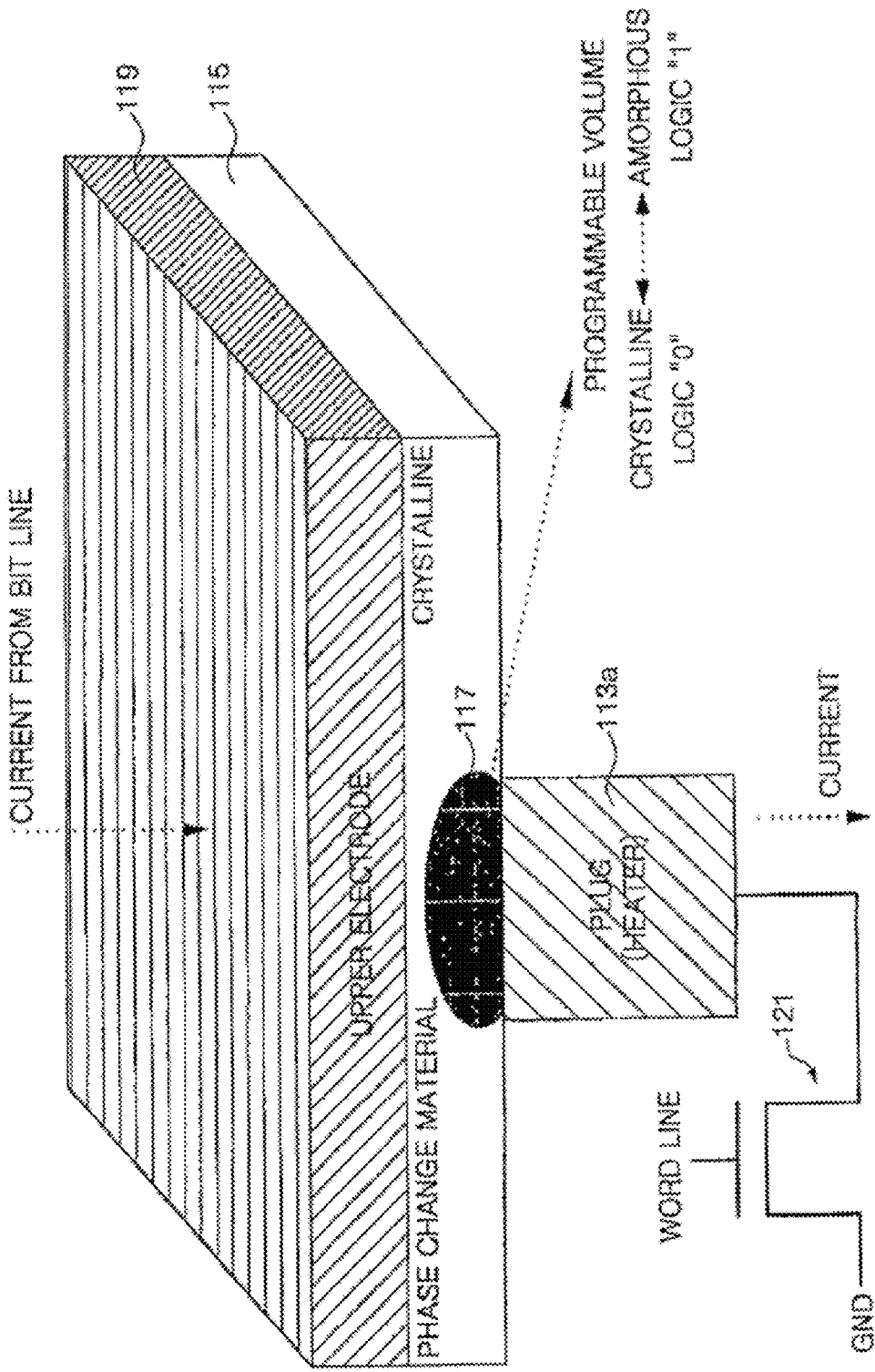
FIG. 2A illustrates a schematic diagram of the memory cell of FIG. 1.
Figure 2B:
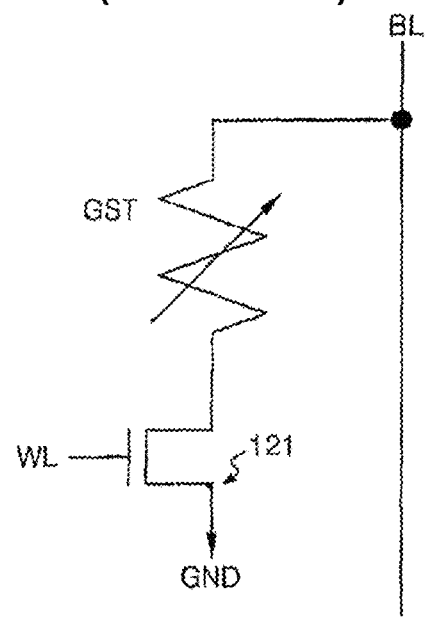
FIG. 2B illustrates an equivalent schematic circuit diagram of a circuit in which the memory cell of FIG. 1 is used.

FIG. 2A includes a schematic diagram of the memory cell of FIG. 1, and FIG. 2B is an equivalent schematic circuit diagram of a circuit in which the memory cell of FIG. 1 is used. Referring to FIGS. 2A and 2B, current from a bit line BL passes through the upper electrode 119 and the GST phase change material 115 to program the programmable volume 117 to the desired state. The GST phase change material 115 is indicated as a variable resistance. A word line is used to control a transistor 121 to enable the programming process. Current through the heater 113a heats the GST phase change material 115 to program the programmable volume 117 to the desired state. In one example configuration, the memory cell is programmed to a logic 0 state when the programmable volume 117 is in the amorphous state and the memory cell is programmed to a logic 1 state when the programmable volume 117 is in the crystalline state.

The memory cell described above can save one of two possible states, namely, a logic 0 state or a logic 1 state. In general, it is beneficial to create a multi-bit memory cell which can store one of more than two possible states to increase the data storage capacity of the memory. A multi-bit PRAM has been developed which uses hybrid states of the programmable volume to store more than one bit of information in a cell. In general, the programmable volume can be programmed to one of three possible states. In a first state, referred to as a fully reset state, the entire programmable volume is programmed to the amorphous state. In a second state, referred to as a fully set state, the entire programmable volume is programmed to the crystalline state. In a third state, part of the programmable volume is programmed to the crystalline state, and another part of the programmable volume is programmed to the amorphous state.

Figure 2C:
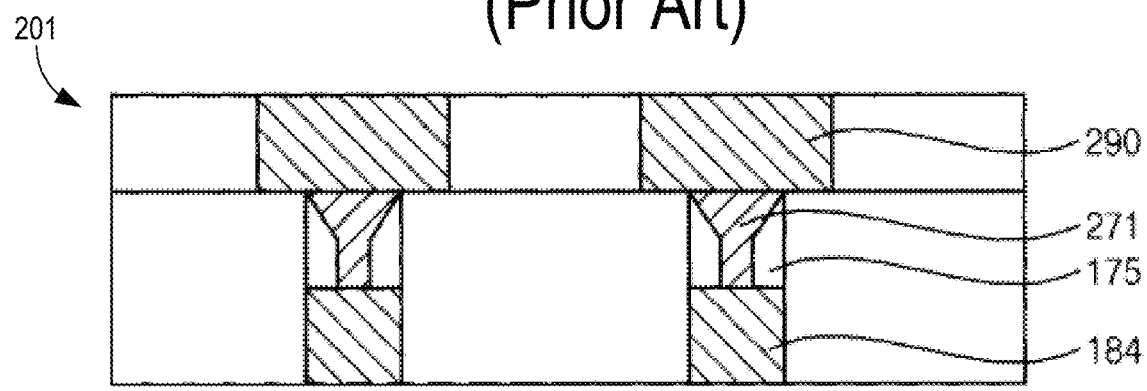
FIG. 2C is a cross-sectional view illustrating a conventional phase-change memory device.

FIG. 2C is a cross-sectional view illustrating a conventional phase-change memory device 201. The phase-change memory device 201 includes a lower electrode 184, an upper electrode 290, a phase change material layer pattern 271, and a spacer 175 disposed on the lower electrode 184.

During a write operation of the phase change memory device 201, when the lower electrode 184 may heat the phase change material layer pattern 271 at a temperature above a melting temperature Tm, and the phase change material layer pattern 271 may be cooled, a phase transformation of the phase change material layer pattern 271 may occur from a crystalline state to an amorphous state (that is, a reset operation). When the lower electrode 184 may heat the phase change material layer pattern 271 at a temperature between a crystallization temperature Tc and the melting temperature Tm, and the phase change material layer pattern 271 may be cooled, a phase transformation of the phase change material layer pattern 271 may occur from the amorphous state to the crystalline state (that is, a set operation). The phase change material layer pattern 271 in the amorphous state may have a larger electrical resistance than the electrical resistance of the phase change material layer pattern 271 in the crystalline state. Therefore, a data stored in the phase change memory unit may be read by detecting the electrical resistance of the phase change material layer pattern 271 during a read operation of the phase change memory device.

Conventional techniques attempt to realize multi-state storage in phase change memory devices by modifying the crystal annealing process to create varying levels of current resistance and thereby obtain multiple resistance states. However, the difference in resistances between neighboring storage states makes state decoding difficult. Furthermore, as the phase change memory devices get smaller, the threshold between the conductive states gets smaller, making it more difficult to build high density multi-state PRAM memories. Thus, there is need for a multi-state phase change memory solution that is not dependent on resistances.

To address these and other concerns, a non-volatile multi-bit storage device can be implemented to allow for multiple logical states, in addition to the two standard logical states (i.e., standard amorphous form and standard crystalline form). For example, additional logical states can be obtained for the multi-bit storage device by exposing the phase change material (that has been doped with n-type or p-type semiconductor impurities) to an electrical field as crystal annealing cool down is performed. Exposing the phase change material to an electrical field during cool down causes the impurities to be distributed within the phase change material to form a rectified current path based on the direction of the electric field. In this way, the non-volatile multi-bit storage device can achieve additional diode-like logical states by applying an electrical field as the crystal annealing cool down is performed. In some cases, additional electrodes can be added such that a non-volatile multi-bit storage device using the phase change material with N pairs of electrodes can store N bits of data to provide 2N states wherein the N electrodes include the phase change electrodes and the electric filed electrodes.

As a non-limiting example, disclosed herein is a non-volatile multi-bit storage device that includes a set of electrodes configured to apply an electric field across the phase change material and thereby enable the device to obtain at least four logical states. In a first logical state (e.g., an amorphous state), the phase change material is solidified in the standard amorphous form. In a second logical state (e.g., a crystalline state), the phase change material is solidified in the standard crystalline form. In a third logical state (sometimes referred to as a first diode state), the phase change material is solidified in a non-standard crystalline form, with the semiconductor impurities forming a rectified current path in a first direction). And in a fourth logical state (sometimes referred to as a second diode state), the phase change material is solidified in a non-standard crystalline form, with the semiconductor impurities forming a rectified current path in a second direction). It will be understood that the number of logical states can vary across embodiments and can depend on, for example, the number of electrodes that can apply an electric field.

Furthermore, techniques for reading a non-volatile multi-bit storage device are disclosed. For example, once the crystal is formed, the state of the non-volatile multi-bit storage device can be read by applying a voltage across the phase change material so that a current may be conducted through the phase change material in different directions using electrodes ohmically coupled to the phase change material. By applying the one or more voltages in various directions and registering the current response in the form of a voltage, the state of the phase change material can be determined, for example using a logic table.

Example Non-Volatile Multi-Bit Storage Device

Figure 3A:
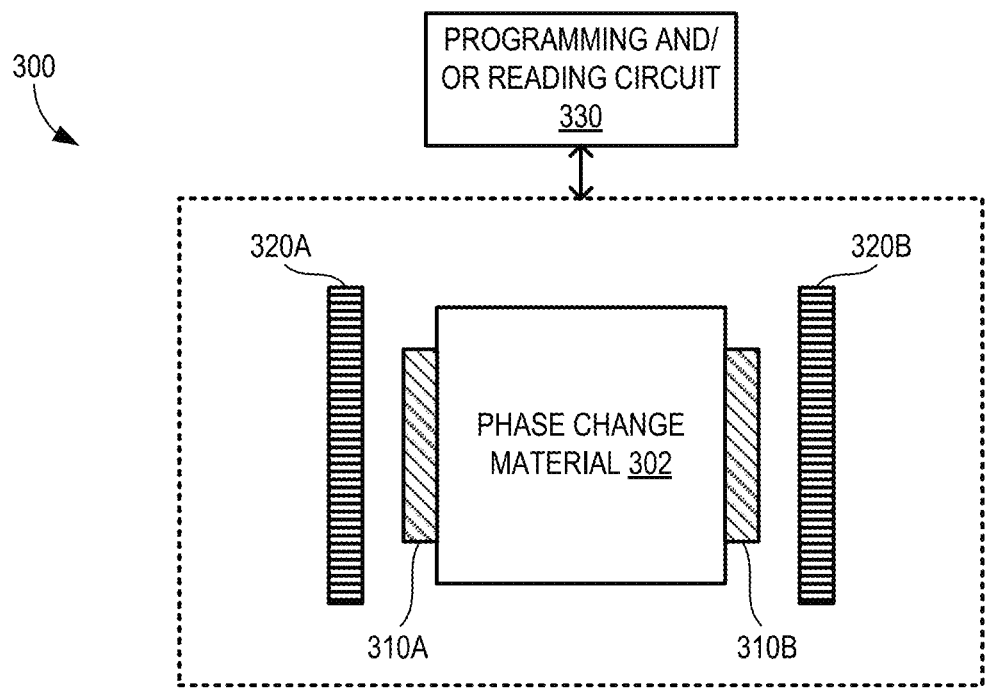
FIGS. 3A-3C illustrate example non-volatile multi-bit storage devices.

FIG. 3A illustrates an example non-volatile multi-bit storage device 300. The device 300 includes a phase change material 302, first electrodes 310A and 310B (individually or collectively referred to as electrode 310 or electrodes 310), second electrodes 320A and 320B (individually or collectively referred to as electrode 320 or electrodes 320), and a programming and/or reading circuit 330. Although the device 300 is illustrated as including the programming and/or reading circuit 330, in some cases, the programming and/or reading circuit 330 is separate from the device 300.

The phase change material 302 can be an embodiment of, or include one or more features of, the phase change material 115 of FIGS. 1 and 2A. In some cases, the phase change material 102 includes a chalcogenide compound (e.g., GeSbTe (GST)) doped with at least one of impurities (X). That is, the at least one of impurities (X) selected from group III, group IV, group V or group VI may be doped into a Ge—Sb—Te system. In some cases, the phase change material 302 is implemented as a phase-change random-access memory (PRAM) device.

The phase change material 302 may include n-type impurities, e.g., phosphorous, arsenic, etc. or p-type impurities, e.g., boron, gallium, etc. For example, the phase change material 302 can be doped with n-type or p-type semiconductor impurities. As described herein, are a write operation (sometimes referred to as programming), the n-type or p-type semiconductor impurities can form a rectified current path through the phase change material 302.

The doping level of the n-type or p-type semiconductor impurities can vary across embodiments. In some cases, the doping level can be any doping level that will react to an electric field such that the impurities create some kind of detectable boundary layer responsive to application of an electric field across the phase change material 302 during crystal annealing cool down. In some cases, the doping level is between about $10^{13}$ and about $10^{18}$ ions/cm3. In some cases, an atomic concentration "a" of impurity elements ranges from about 0<a≤about 0.25, about 0<a≤about 0.2.

The impurity elements may vary across embodiments. In some cases, the impurity elements may include one or more of Arsenic (As), boron (B), or other n or p type semiconductor impurities. However, it will be understood that any suitable impurity elements may be used.

The phase change material 302 is configured to store a first data bit as at least one of a crystalline form of the phase change material or an amorphous form of the phase change material. For example, the phase change material 302 can be configured to change between a crystalline form and an amorphous form to store a first data bit in the phase change material 302. In some cases, the n-type or p-type semiconductor impurities are included in the phase change material 302 at a concentration that is configured to form a rectified current path through the phase change material 302 responsive to application of an electric field across the phase change material 302 to store a second data bit in the phase change material 302.

The first electrodes 310 (sometimes referred to as phase change material electrodes 310) are located on first and second opposing sides of the phase change material 302 and can be ohmically coupled to the phase change material 302. In some cases, when a suitable voltage is applied between the first electrodes 310, the first electrodes 310 heat the phase change material 302, thereby causing the phase change material 302 to undergo a phase transition from one of an amorphous state or a crystalline state to another of the amorphous state or a crystalline state. For example, in some cases (such as during a write operation of the device 300), at least one of the first electrodes 310 may heat the phase change material 302 at a temperature above a melting temperature Tm. In some such cases, the phase change material 302 may be cooled and a phase transformation of the phase change material 302 may occur from a crystalline state to an amorphous state. As another example, at least one of the first electrodes 310 may heat the phase change material 302 at a temperature between a crystallization temperature Tc and the melting temperature Tm. In some such cases, the phase change material 302 may be cooled and a phase transformation of the phase change material 302 may occur from the amorphous state to the crystalline state.

In some cases, the first electrodes 310 may be utilized to read or determine a logical state of the phase change material 302. For example, as described in more detail herein, the first electrodes 310 can be used to apply one or more currents of one or more directions to the phase change material 302 to determine available current paths. In some cases, the available current paths are indicative of the current logical state of the phase change material 302. One or more of the first electrodes 310 can be an embodiment of, or include one or more features of, the upper electrode 119 of FIG. 1, or the lower electrode 184 or the upper electrode 290 of FIG. 2C.

The first electrodes 310 can be coupled to a first data bit line. As described herein, the phase change material 302 is configured to store the first data bit as at least one of a crystalline state of the phase change material or an amorphous state of the phase change material.

The second electrodes 320 (sometimes referred to as electric field electrodes 320) are located on first and second opposing sides of the phase change material 302. The second electrodes 320 are separated from the phase change material 302 by a distance (e.g., a dielectric gap) configured to form an electric field across the phase change material 302. The second electrodes 320 can be coupled to a second data bit line.

In some cases, the second electrodes 320 may be utilized to obtain additional logical states from the non-volatile multi-bit storage device 300. For example, as described herein, the second electrodes 320 can be configured to apply an electric field to the phase change material 302 to cause the n-type or p-type semiconductor impurities to create a detectable boundary layer (e.g., PN junction, NP junction). In some cases, the second electrodes 320 are configured to apply an electric field to the phase change material 302 during a cooling period, which enables the impurities to react to the electric field. In some cases, the second electrodes 320 are configured to apply an electric field to the phase change material 302 during a heating period, which enables the impurities to react to the electric field. For example, in some such cases, the first electrodes 310 can heat the phase change material 302 and, concurrently, the second electrodes 320 can apply the electric field.

Although illustrated as a pair of electrodes, the second electrodes 320 can include more or fewer than two electrodes. In some cases, the second electrodes 320 can include multiple pairs of electrodes. For example, the second electrodes 320 can include a second pair of electrodes (not shown) located at third and fourth opposing sides of the phase change material 302. Each pair of electrodes can include electrodes located on opposing sides of the phase change material 302, and, in some cases, each pair of electrodes is on a different side of the phase change material 302 as any other pair of electrodes.

In the illustrated example of FIG. 3A, each of the first electrodes 310 is located between a respective one of the second electrodes 320 and the phase change material 302. However, this configuration should not be construed as limiting. For example, in some cases, the first electrodes 310 and the second electrodes 320 are located on different sides of the phase change material 302.

The programming and/or reading circuit 330 include circuitry for facilitating the heating of the phase change material 302 (e.g., via the first electrodes 310), the programming of the phase change material 302 (e.g., via the second electrodes 320), and/or the reading of the phase change material 302 (e.g., via first electrodes 310). For example, as described herein, the programming and/or reading circuit 330 can include a power source with a configurable polarity such that the programming and/or reading circuit 330 can configure a direction of current applied by the first electrodes 310 and/or a direction of an electric field applied by the second electrodes 320.

Figure 3B:
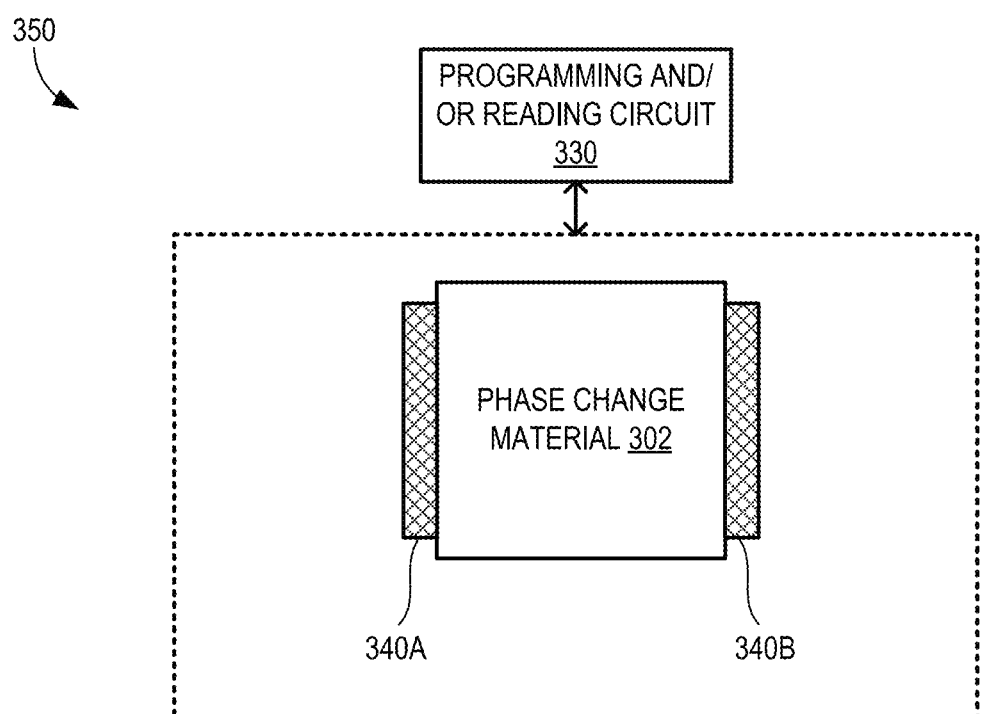

FIG. 3B illustrates example non-volatile multi-bit storage device 350. In this example, the non-volatile multi-bit storage device 350 is similar to the non-volatile multi-bit storage device 300 of FIG. 3A, except that it includes a single pair of electrodes 340A, 340B (individually or collectively referred to as electrode 340 or electrodes 340) instead of the electrodes 310 and 320. In this way, the electrodes 340 can be configured to perform the functions of the first electrodes 310 (e.g., heating and/or reading) and/or the second electrodes 320 (e.g., programming). Although the electrodes 340 are illustrated as being located on first and second opposing sides of the phase change material 302, it will be understood that the location of the electrodes can vary. For example, in some cases, the electrodes 340 are separated from the phase change material by a distance (e.g., a dielectric gap).

Figure 3C:
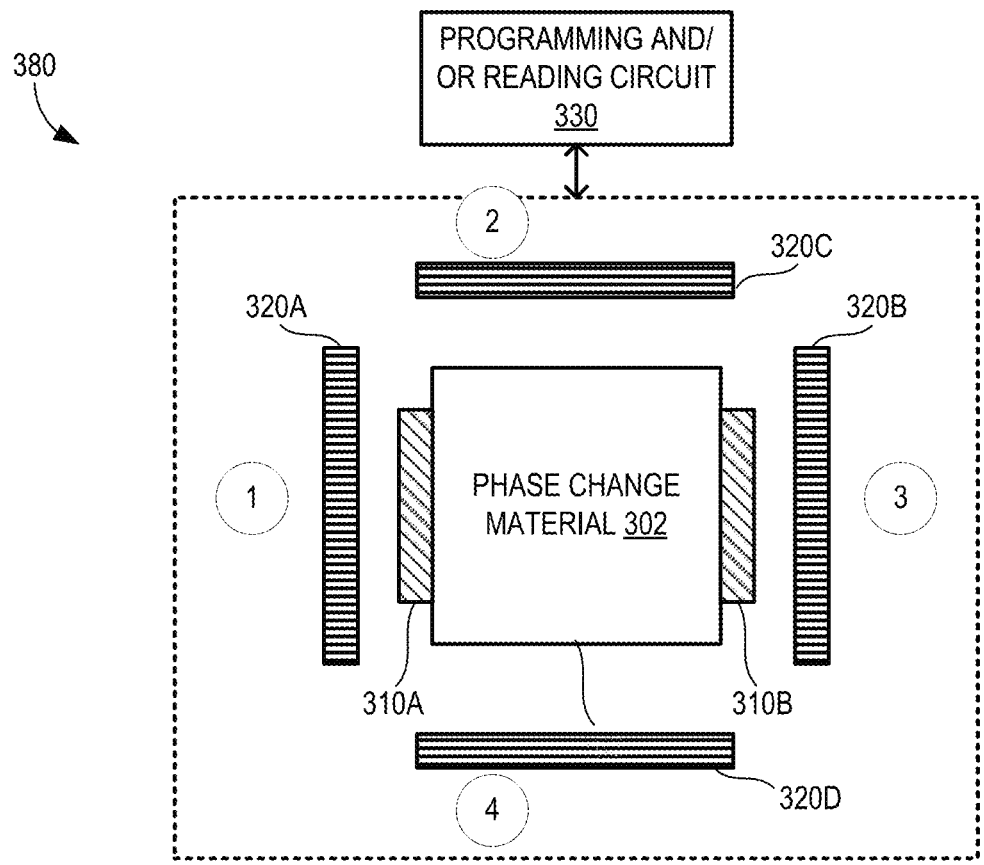

FIG. 3C illustrates example non-volatile multi-bit storage device 380. In this example, the non-volatile multi-bit storage device 380 is similar to the non-volatile multi-bit storage device 300 of FIG. 3A, except that it includes an addition pair of second electrodes 320C, 320D. Providing another pair of second electrodes offers the ability to obtain additional logical states. In this example, four electrodes (1) 320A, (2) 320C, (3) 320B, and (4) 310C allows for 18 logical states: (1) amorphous (no current in any direction); (2) crystalline (current in every direction); (3) horizontal NP junction, current flows right 1→3; (4) horizontal PN junction, current flows left 1←3; (5) vertical NP junction, current flows down 2→4; (6) vertical PN junction, current flows up 2←4; (7). 45 deg NP junction, current flows through 45 deg path 1,4→2,3; (8) 45 deg PN junction, current flows through 225 deg path 1,4←2,3 (9) 135 deg NP junction, current flows through 135 deg path 3,4→1,2; (10) 135 deg PN junction, current flows through 315 deg path 3,4←1,2; (11) NP on 1, 1→2,3,4; (12) PN on 1, 1←2,3,4; (13) NP on 2, 2→1,3,4; (14) PN on 2, 2←1,3,4; (15) NP on 3, 3→1,2,4; (16) PN on 3, 3←1,2,4; (17) NP on 4, 4→1,2,3; and (18) PN on 4, 4←1,2,3. It will be understood that the number of possible logical states can be increased or decreased by adding or removing electrodes that can introduce any electric field to the phase change material 302. For example, in an instance where the phase change material 302 is in the shape of a cube, 6 electrodes may be placed proximate each face of the phase change material 302.

Figure 4:
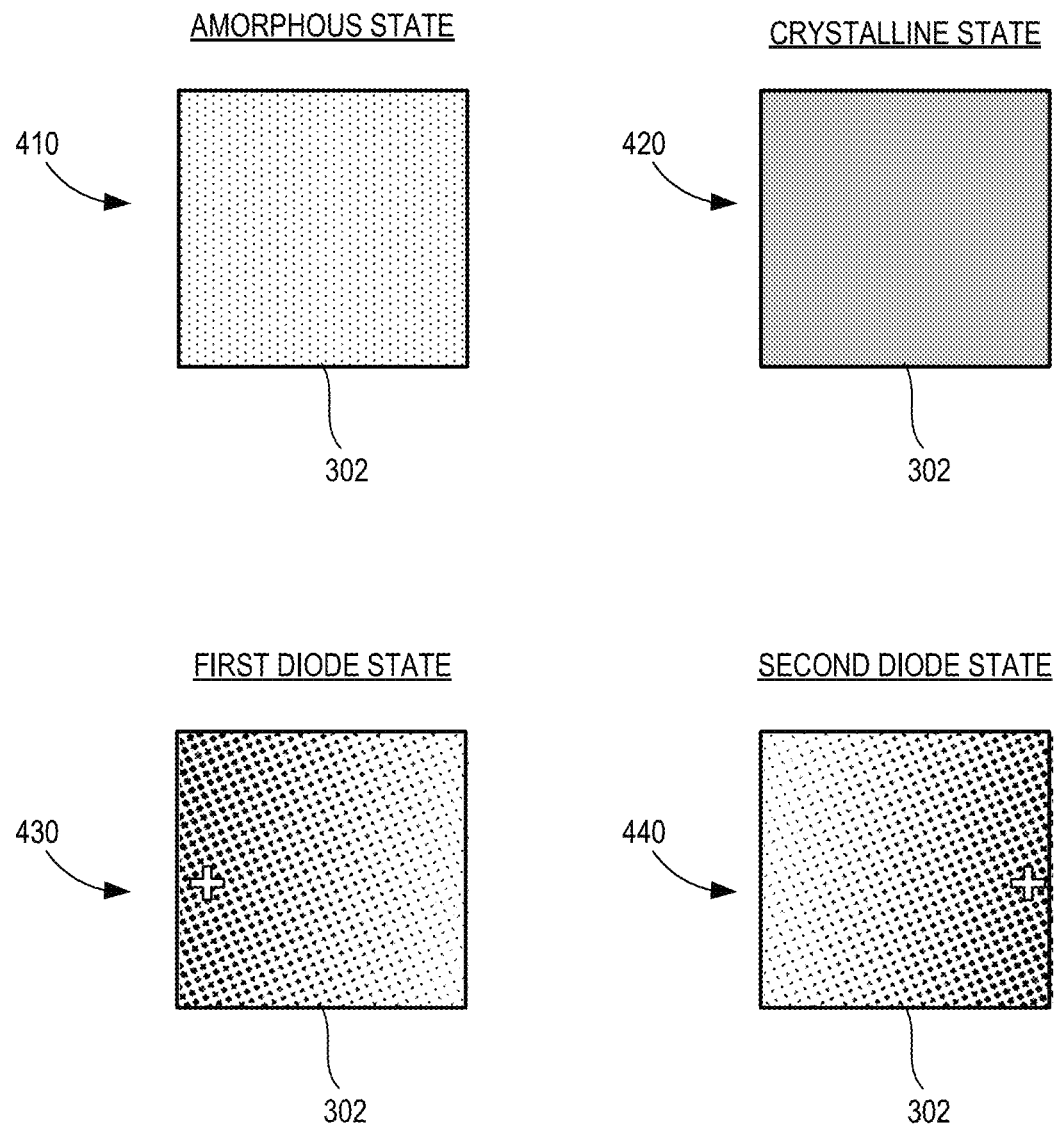
FIG. 4 includes illustrations of example impurities distributions associated with potential logical states of the phase change material of FIG. 3A.

FIG. 4 includes illustrations of example impurities distributions associated with potential logical states of the phase change material 302 of FIG. 3A. In this example, the impurities distributions for four logical states are shown: an amorphous state 410, a crystalline state 420, a first diode state 430, and a second diode state 440. It will be appreciated that the example distributions are for illustration purposes only and should not be construed as limiting.

In the amorphous state 410, the phase change material 302 is a non-crystalline solid in which the impurities are not organized in a definite lattice pattern. Here, the phase change material 302 may have a larger electrical resistance than the electrical resistance of the phase change material 302 in a crystalline state. In some cases, an amorphous state 410 can be identified by applying a current through the phase change material 302 in a first direction (e.g., from electrode 310A to 310B) and determining that the resulting current through the phase change material 302 is 0 or approximately 0, and applying a current through the phase change material 302 in a second direction (e.g., from electrode 310B to 310B) and determining that the resulting current through the phase change material 302 is 0 or approximately 0.

In the crystalline state 420, the phase change material 302 is a crystalline solid in which the impurities are characterized by a time-invariant, regular three-dimensionally periodic arrangement. Here, the phase change material 302 may have a smaller electrical resistance than the electrical resistance of the phase change material 302 in an amorphous state. In some cases, a crystalline state 420 can be identified by applying a current through the phase change material 302 in the first direction and determining that the resulting current through the phase change material 302 is non-zero and applying a current through the phase change material 302 in the second direction and determining that the resulting current through the phase change material 302 is non-zero.

In the first diode state 430, the phase change material 302 is a crystalline solid in which the impurities are characterized by a distribution of positive ions closer to the left side (closer to electrode 320A) of the phase change material 302, and a distribution of negative impurities closer to the right side (closer to electrode 320B) of the phase change material 302 In this way, the impurities form a rectified current path through the phase change material such that electrical current passes through in only one direction (e.g., from electrode 310A to electrode 310B). In some cases, a first diode state 430 can be identified by applying a current through the phase change material 302 in the first direction and determining that the resulting current through the phase change material 302 is non-zero and applying a current through the phase change material 302 in the second direction and determining that the resulting current through the phase change material 302 is zero.

In the second diode state 440, the phase change material 302 is a crystalline solid in which the impurities are characterized by a distribution of positive ions closer to the right side (closer to electrode 320B) of the phase change material 302, and a distribution of negative ions closer to the left side (closer to electrode 320A) of the phase change material 302 In this way, the impurities form a rectified current path through the phase change material such that electrical current passes through in only one direction (e.g., from electrode 310B to electrode 310A). In some cases, a second diode state 440 can be identified by applying a current through the phase change material 302 in the first direction and determining that the resulting current through the phase change material 302 is zero and applying a current through the phase change material 302 in the second direction and determining that the resulting current through the phase change material 302 is non-zero.

Programming a Non-Volatile Multi-Bit Storage Device

Figure 5A:
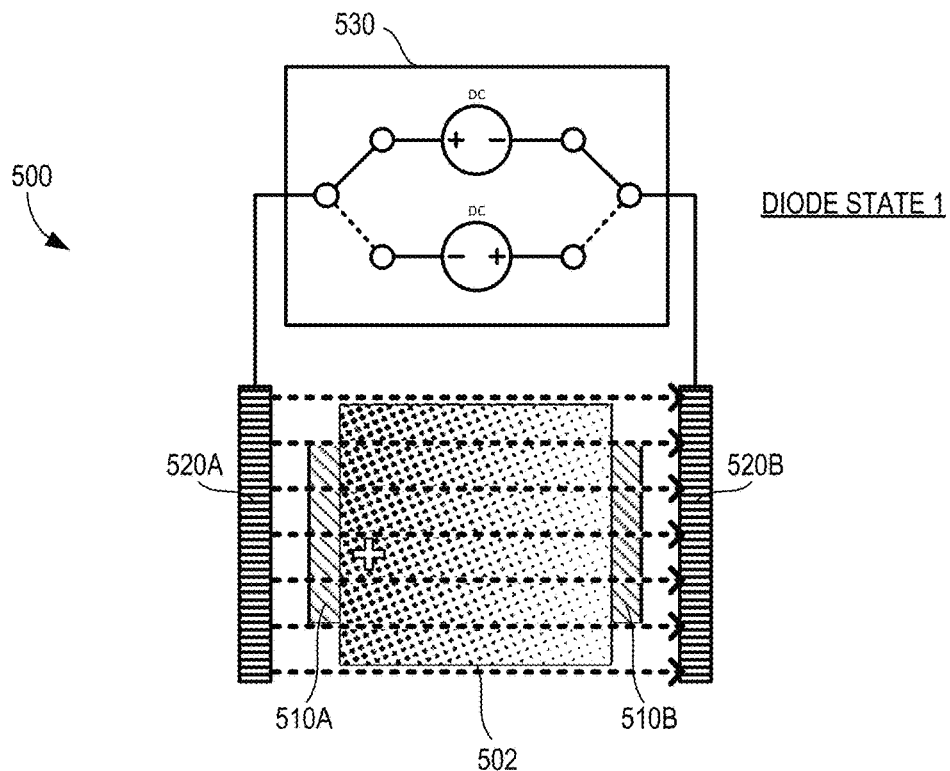
FIGS. 5A and 5B are block diagrams illustrating example systems for programming a non-volatile multi-bit storage device.
Figure 5B:
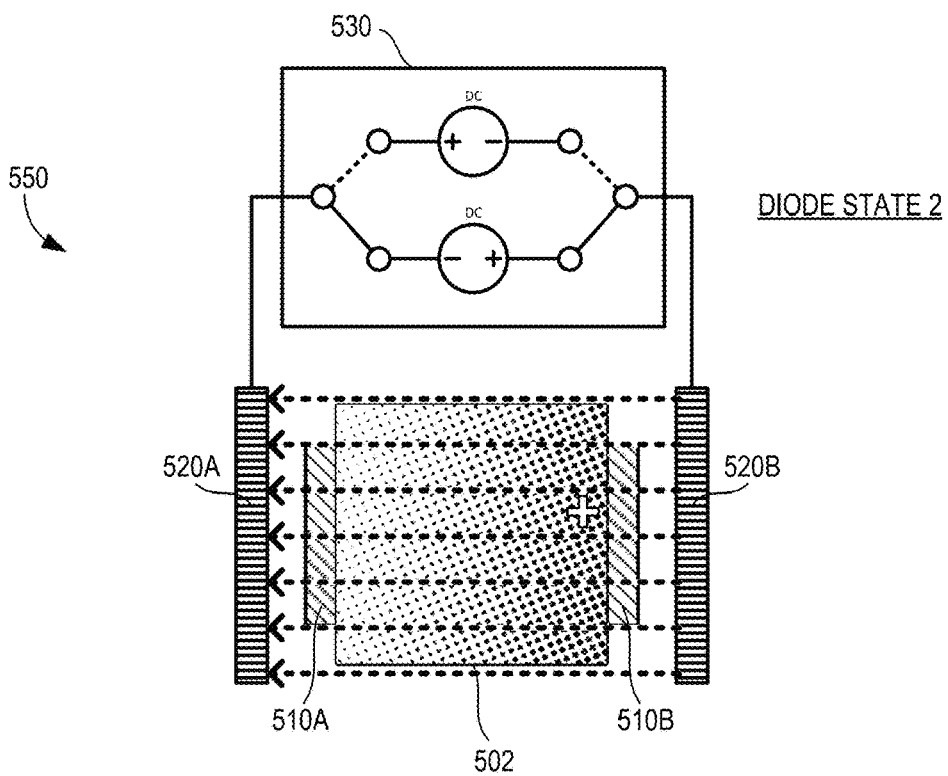

FIGS. 5A and 5B are block diagrams illustrating example systems 500, 550 for programming a non-volatile multi-bit storage device, such as the non-volatile multi-bit storage device 300 of FIG. 3A. In this example, the systems 500, 550 include a phase change material 502 doped with n-type or p-type semiconductor impurities, first electrodes 510A, 510B (sometimes referred to as 'phase change material' electrodes), second electrodes 520A, 520B (sometimes referred to as 'electric field' electrodes, and a programming circuit 530. It will be understood that the system 500 can include fewer, more, or different components, depending on the embodiments.

The programming circuit 530 provides a DC voltage to the second electrodes 520A, 520B. The polarity and/or absolute value of the DC voltage provided by the programming circuit 530 can vary based on the desired logical state of the phase change material 502. It will be appreciated that although DC voltage is described, other forms of energy such as current or resistance can be used.

Referring to FIG. 5A, the phase change material 502 is programmed into a first diode state. For example, as described herein, the phase change material 302 is heated to a temperature associated with a crystalline state. In some cases, the phase change material 502 is heated using at least one of the first electrodes 510A, 510B.

After the phase change material 502 is heated, and during a cooling period of the phase change material 502, the system 500 applies an electric field across the phase change material 502 using the second electrodes 520A, 520B. In this example, the programming circuit 530 provides a DC voltage such that the positive voltage is on the second electrode 520A and the negative voltage is on the second electrode 520B. As such, the application of the DC voltage causes the second electrode 520A, 520B to apply and electric field (shown the arrows) that moves from left to right.

As described herein, by applying an electric field across the phase change material 502 during the cooling period, the system 500 can change the distribution of the semiconductor impurities within the phase change material 502. In this example, the positive ions of the semiconductor impurities are shown as dots within the phase change material 502. As such, in this example, it can be seen that the left side of the phase change material 502 is the "positive" side and the right side of the phase change material 502 is the "negative" side. In this way, the semiconductor impurities of the phase change material 502 to form a rectified current path that allows electrical current to pass through the phase change material 5023 only in one direction (e.g., left to right). As a result, in FIG. 5A, the phase change material 502 is in a first diode state.

Referring to FIG. 5B, the phase change material 502 is programmed into a second diode state. For example, as described herein, the phase change material 302 is heated to a temperature associated with a crystalline state. In some cases, the phase change material 502 is heated using the first electrodes 510A, 510B.

After the phase change material 502 is heated, and during a cooling period of the phase change material 502, the system 500 applies an electric field across the phase change material 502 using the second electrodes 520A, 520B. In this example, the programming circuit 530 provides a DC voltage such that the negative voltage is on the second electrode 520A and the positive voltage is on the second electrode 520B. As such, the application of the DC voltage causes the second electrode 520A, 520B to apply and electric field (shown the arrows) that moves from right to left.

As described herein, by applying an electric field across the phase change material 502 during the cooling period, the system 500 can change the distribution of the semiconductor impurities within the phase change material 502. In this example, the positive ions of the semiconductor impurities are shown as dots within the phase change material 502. As such, in this example, it can be seen that the right side of the phase change material 502 is the "positive" side and the left side of the phase change material 502 is the "negative" side. In this way, the semiconductor impurities of the phase change material 502 to form a rectified current path that allows electrical current to pass through the phase change material 5023 only in one direction (e.g., right to left). As a result, in FIG. 5B, the phase change material 502 is in a second diode state.

Figure 6:
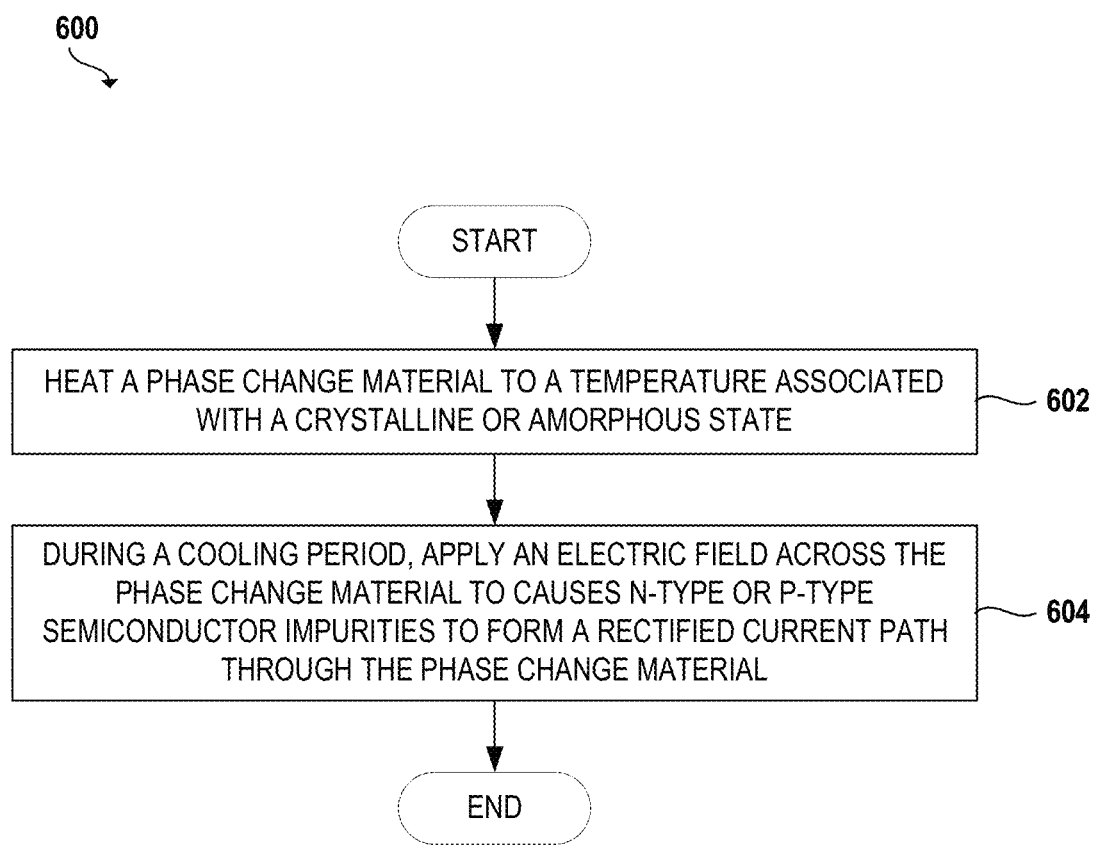
FIG. 6 is a flow diagram illustrative of an example routine for programming a non-volatile multi-bit storage device.

FIG. 6 is a flow diagram illustrative of an example routine 600 for programming a non-volatile multi-bit storage device, such as the non-volatile multi-bit storage device 300 of FIG. 3A. The elements outlined for routine 600 can be implemented by a non-volatile multi-bit storage device (e.g., non-volatile multi-bit storage device 300 of FIG. 3A), by a user, by one or more computing devices that are associated with a non-volatile multi-bit storage device, or a combination thereof. For ease of description, the routine 600 has been logically associated as being generally performed by the device 300, but the following illustrative example should not be construed as limiting.

At block 602, the phase change material 302 is heated to a temperature associated with a crystalline or amorphous state. As described herein, the device 300 can include a pair of phase change material electrodes 310 that are located on first and second opposing sides of the phase change material 302 and are ohmically coupled to the phase change material 302.

As described herein, the phase change material 302 can have two forms, namely, an amorphous form and a crystalline form, which is controlled by heat provided to the phase change material 302 by an applied current. The temperature at which the device 300 heats the phase change material 302 can vary across embodiments. For example, in some cases to solidify into an amorphous form, the temperature is at or above a melting temperature, Tm, of the phase change material 302. As another example, in some cases to solidify into a crystalline form, the temperature is between a crystallization temperature, Tc, and the melting temperature, Tm, of the phase change material 302. However, it will be understood that the particular can vary based on a desired state of the phase change material 302.

At block 602, during a cooling period of the phase change material 302, the device 300 applies an electric field across the phase change material 302. As described herein, by applying an electric field across the phase change material 302 during the cooling period, the device 300 can change the distribution of the semiconductor impurities within the phase change material 302. In particular, the electric field causes the semiconductor impurities of the phase change material 302 to form a rectified current path that allows electrical current to pass through the phase change material 3023 only in one direction. For example, in some cases, application of the electric field causes the n-type or p-type semiconductor impurities to form a PN junction, the "p" (positive) side contains an excess of holes, and the "n" (negative) side contains an excess of electrons in the outer shells of the electrically neutral atoms there. In some such cases, electrical current passes through the junction only in one direction (e.g., from positive to negative).

The device 300 can apply the electric field using the second electrodes 320. As described herein, the direction of the rectified current path depends on the direction of the electric field applied by the second electrodes 320. And the direction of the electric field applied by the second electrodes 320 is based on the polarity of the voltage source 530.

The cooling period can refer to a period after which the phase change material 302 is heated to a desired temperature and begins to cool so as to solidify in amorphous or crystalline form. The duration of the cooling period can vary across embodiments. For example, in some cases, a rapid cooling (e.g., 4 K/min) can cause the phase change material 302 to solidify in amorphous form, while a slower cooling (e.g., 0.5 K min) can cause the phase change material 302 to solidify in crystalline form.

Rapidly cooling the phase change material 302 can cause the phase change material 302 to solidify in amorphous form, while slowly cooling the phase change material 302 can cause the phase change material 302 to solidify in crystalline form. Furthermore, the presence (or absence) of an electric field during the cooling period can affect the distribution of the with n-type or p-type semiconductor impurities within the phase change material 302. For example, if no electric field is applied during the cooling period, then the phase change material 302 will solidify in the standard crystalline form, which allows current in both direction from the first electrodes 520A, 520B. In contrast, if no electric field is applied during the cooling period, then the phase change material 302 will solidify in the standard crystalline form, which allows current in both direction from the first electrodes 520A, 520B.

It will be understood, that in some of embodiments, one or more of the blocks described herein with respect to FIG. 6 can be omitted, performed concurrently or in a different order. Accordingly, the illustrated embodiment and description should not be construed as limiting. For example, in some cases (such as to obtain an amorphous state or a crystalline state), no electric field is applied during the cooling period.

Reading a Non-Volatile Multi-Bit Storage Device

Figure 7:
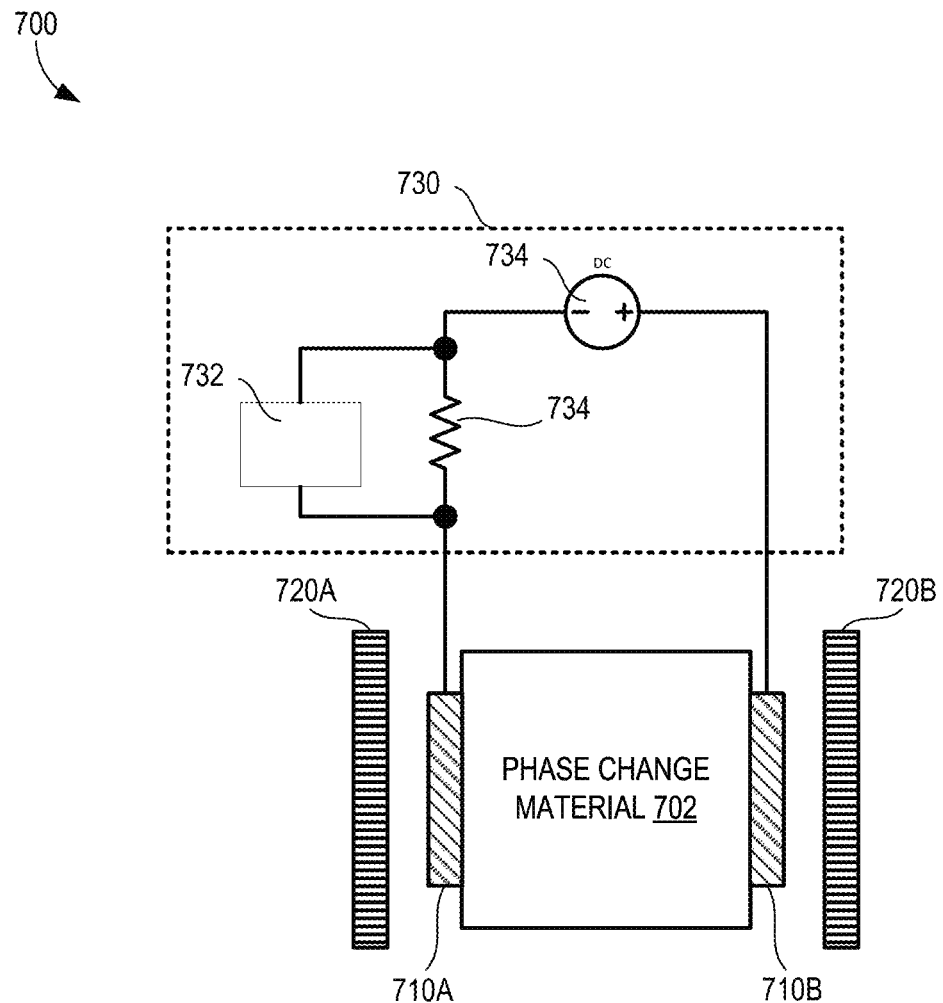
FIG. 7 is a block diagram illustrating an example system for reading a non-volatile multi-bit storage device.

FIG. 7 is a block diagram illustrating an example system 700 for reading a non-volatile multi-bit storage device, such as the non-volatile multi-bit storage device 300 of FIG. 3A. In this example, the system 700 includes a phase change material 702 doped with n-type or p-type semiconductor impurities, first electrodes 710A, 710B (sometimes referred to as 'phase change material' electrodes), second electrodes 720A, 720B (sometimes referred to as 'electric field' electrodes, and a reading circuit 730. It will be understood that the system 700 can include fewer, more, or different components, depending on the embodiments. The system 700 can be an embodiment of the multi-bit storage device 300 of FIG. 3A.

The reading circuit 730 can be configured to apply a particular polarity of a current or voltage to the phase change material 702 using the first electrodes 710A, 710B, and can be configured to measure a corresponding voltage across the resistor 734. In some cases, the reading circuit 730 can serially apply various currents to determine the corresponding voltages across the resistor 734, which can be used to determine the current logical state of the phase change material 702. An example truth table corresponding to the four logical states can be found in Table 1, below, where "0" corresponds to little or no voltage across the resistor 734 and "1" correspond to a voltage across the resistor 734 that satisfies a threshold.

TABLE 1

Truth Table for determining a logical state of phase change material 702 of FIG. 7A

| | Current Applied from: | |
|---|---|---|
| State | 710A to 710B | 710A to 710B |
| Amorphous State | 0 | 0 |
| First Diode State | 0 | 1 |
| Second Diode State | 1 | 0 |
| Crystalline State | 1 | 1 |

As shown by Table 1, if there is no current flow from electrode 710A to electrode 710B and no current flow from electrode 710B to electrode 710A, then it can be determined that the phase change material 302 is in an amorphous state. If there no current flow from electrode 710A to electrode 710B and some current flow from electrode 710B to electrode 710A, then it can be determined that the phase change material 302 is in a first diode state. If there is some current flow from electrode 710A to electrode 710B and no current flow from electrode 710B to electrode 710A, then it can be determined that the phase change material 302 is in a second diode state. If there is some current flow from electrode 710A to electrode 710B and some current flow from electrode 710B to electrode 710A, then it can be determined that the phase change material 302 is in a crystalline state.

Figure 8:
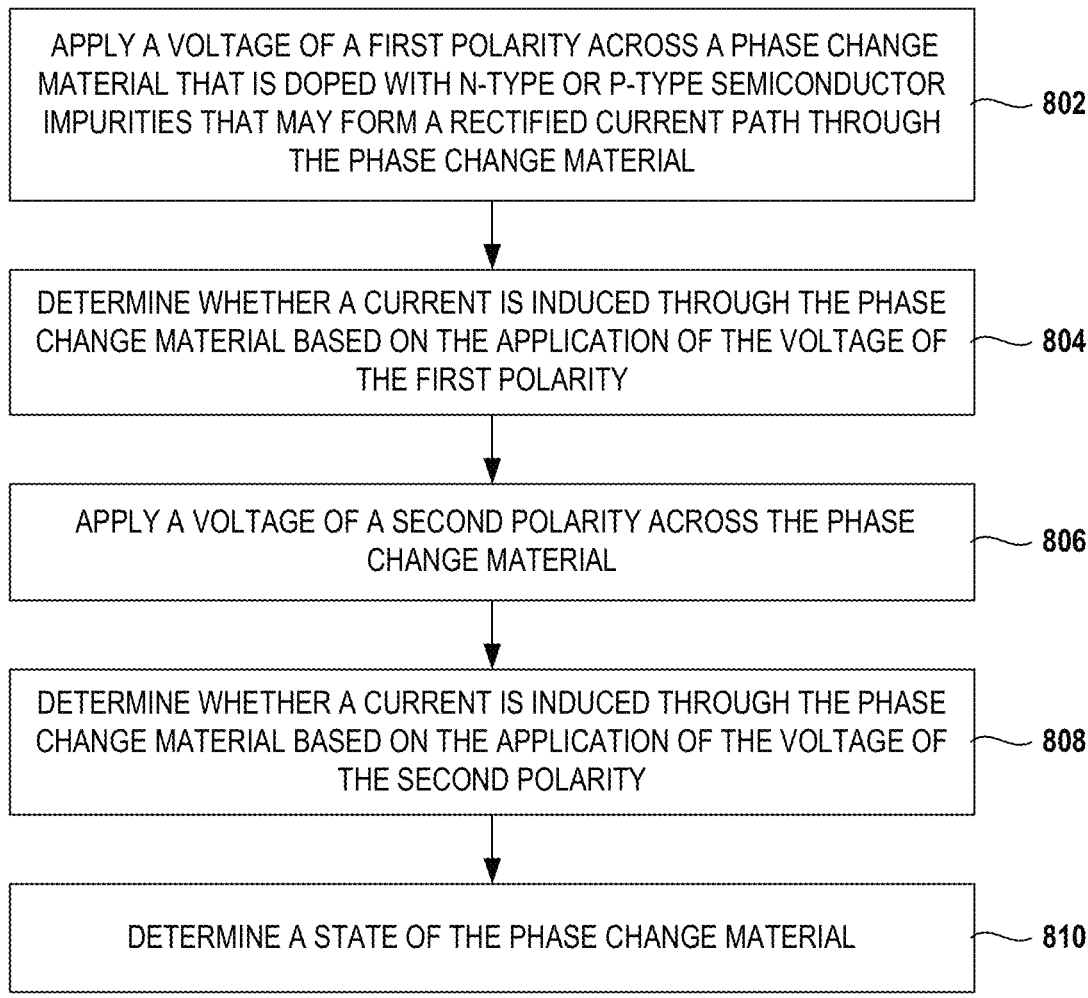
FIG. 8 is a flow diagram illustrative of an example routine for reading a non-volatile multi-bit storage device.

FIG. 8 is a flow diagram illustrative of an example routine 800 for reading a non-volatile multi-bit storage device, such as the non-volatile multi-bit storage device 300 of FIG. 3A. The elements outlined for routine 800 can be implemented by a non-volatile multi-bit storage device (e.g., non-volatile multi-bit storage device 300 of FIG. 3A), by a user, by one or more computing devices that are associated with a non-volatile multi-bit storage device, or a combination thereof. For case of description, the routine 800 has been logically associated as being associated with the multi-bit storage device 300, but the following illustrative example should not be construed as limiting.

At block 802, a voltage of a first polarity is applied across the electrodes 310 via a voltage source 734. As described herein, the electrodes 310 are ohmically coupled to the phase change material 302 and located on first and second opposing sides of the phase change material 302.

At block 804, a measuring device 732 determines a voltage across the resistor 734. As described herein, depending on a logical state of the phase change material 302, the semiconductor impurities of the phase change material 302 may form a rectified current path with the phase change material 302. Accordingly, by assessing whether a current is created by applying the voltage via the electrodes 310, the logical state of the phase change material 302 can be determined.

As a non-limiting example, assume that the first polarity causes a positive voltage from the electrode 710A to the electrode 710B. In some such cases, if there is a current path from the electrode 710A to the electrode 710B, then a voltage will be read by the measuring device 732, and it can be determined that the logical state of the phase change material 302 is either a 'second diode state' or a 'crystalline state,' according to the truth table to Table 1. In contrast, if there is not a current path from the electrode 710A to the electrode 710B, then no voltage will be read by the measuring device 732, and it can be determined that the logical state of the phase change material 302 is either an "amorphous state' or a 'first diode state.'

At block 806, a voltage of a second polarity is applied across the electrodes 310 via a voltage source 734, where the second polarity is opposite the first polarity.

At block 808, the measuring device 732 determines a voltage across the resistor 734. Continuing with the example above, if there is a current path from the electrode 710B to the electrode 710A, then a voltage will be read by the measuring device 732, and if there is no current path from the electrode 710B to the electrode 710A, then no voltage will be read by the measuring device 732.

At block 810, the logical state of the non-volatile multi-bit storage device is determined based on the measurements at block 804 and 808. In particular, if there is no current path from the electrode 710A to the electrode 710B and no current path from the electrode 710B to the electrode 710A, then the logical state is an amorphous state. If there is no current path from the electrode 710A to the electrode 710B and a current path from the electrode 710B to the electrode 710A, then the logical state is a first diode state. If there is a current path from the electrode 710A to the electrode 710B and no current path from the electrode 710B to the electrode 710A, then the logical state is a second diode state. If there is a current path from the electrode 710A to the electrode 710B and a current path from the electrode 710B to the electrode 710A, then the logical state is a crystalline state It will be understood, that in some of embodiments, one or more of the blocks described herein with respect to FIG. 8 can be omitted, performed concurrently or in a different order.

Terminology

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer, or section. Thus, a first element, component, region, layer, or section discussed below could be termed a second element, component, region, layer, or section without departing from the teachings of the at least one example embodiment.

Spatially relative terms, such as "beneath," "below," "lower," "above," "upper" and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "include," "can include," and the like are to be construed in an inclusive sense, as opposed to an exclusive or exhaustive sense; that is to say, in the sense of "including, but not limited to." Additionally, the words "herein," "above," "below," and words of similar import, when used in this application, refer to this application as a whole and not to any particular portions of this application. Where the context permits, words in the above Detailed Description using the singular or plural number may also include the plural or singular number, respectively. The word "or" in reference to a list of two or more items, covers all of the following interpretations of the word: any one of the items in the list, all of the items in the list, and any combination of the items in the list. Likewise the term "and/or" in reference to a list of two or more items, covers all of the following interpretations of the word: any one of the items in the list, all of the items in the list, and any combination of the items in the list.

Depending on the embodiment, certain operations, acts, events, or functions of any of the routines described elsewhere herein can be performed in a different sequence, can be added, merged, or left out altogether (non-limiting example: not all are necessary for the practice of the algorithms). Moreover, in certain embodiments, operations, acts, functions, or events can be performed concurrently, rather than sequentially.

These and other changes can be made to the present disclosure in light of the above Detailed Description. While the above description describes certain examples of the present disclosure, and describes the best mode contemplated, no matter how detailed the above appears in text, the present disclosure can be practiced in many ways. Details of the system may vary considerably in its specific implementation, while still being encompassed by the present disclosure disclosed herein. As noted above, particular terminology used when describing certain features or aspects of the present disclosure should not be taken to imply that the terminology is being redefined herein to be restricted to any specific characteristics, features, or aspects of the present disclosure with which that terminology is associated. In general, the terms used in the following claims should not be construed to limit the present disclosure to the specific examples disclosed in the specification, unless the above Detailed Description section explicitly defines such terms. Accordingly, the actual scope of the present disclosure encompasses not only the disclosed examples, but also all equivalent ways of practicing or implementing the present disclosure under the claims.

Disjunctive language such as the phrase "at least one of X, Y, or Z," unless specifically stated otherwise, is otherwise understood with the context as used in general to present that an item, term, etc., may be either X, Y, or Z, or any combination thereof (non-limiting examples: X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described elsewhere herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

Any terms generally associated with circles, such as "radius" or "radial" or "diameter" or "circumference" or "circumferential" or any derivatives or similar types of terms are intended to be used to designate any corresponding structure in any type of geometry, not just circular structures. For example, "radial" as applied to another geometric structure should be understood to refer to a direction or distance between a location corresponding to a general geometric center of such structure to a perimeter of such structure; "diameter" as applied to another geometric structure should be understood to refer to a cross sectional width of such structure; and "circumference" as applied to another geometric structure should be understood to refer to a perimeter region. Nothing in this specification or drawings should be interpreted to limit these terms to only circles or circular structures.

What is claimed is:

1. A method for programming a non-volatile multi-bit storage device, comprising:

heating a phase change material to a temperature that facilitates a transition to either a crystalline or an amorphous state;

during a cooling period, applying an electric field across the phase change material using a pair of electric field electrodes separated from the phase change material by a dielectric gap, wherein the phase change material includes n-type or p-type semiconductor impurities, wherein application of the electric field induces a distribution of the semiconductor impurities within the phase change material to form a rectified current path.

2. The method of claim 1, wherein the phase change material is heated by passing a current through a pair of phase change material electrodes that are ohmically coupled to the phase change material, wherein the pair of phase change material electrodes are positioned on opposing sides of the phase change material.

3. The method of claim 2, wherein the pair of phase change material electrodes is different from the pair of electric field electrodes.

4. The method of claim 2, wherein the pair of phase change material electrodes is the pair of electric field electrodes.

5. The method of claim 1, wherein the semiconductor impurities include at least one of arsenic, phosphorous, boron, or gallium.

6. The method of claim 1, wherein the semiconductor impurities include at least one element from group IV of the periodic table.

7. The method of claim 1, wherein the phase change material comprises a chalcogenide compound doped with semiconductor impurities to facilitate multi-state programming within the storage device.

8. The method of claim 1, wherein the phase change material is a $Ge_2Sb_2Te_5$ compound.

9. The method of claim 1, wherein the non-volatile multi-bit storage device comprises a plurality of electrode pairs, each configured to enable storage of an additional data bit, thereby enabling the device to support $2^N$ different states, where N represents the total number of electrode pairs comprising both phase change material electrodes and electric field electrodes.

10. A non-volatile multi-bit storage system, comprising:
a phase change material configured to transition between a crystalline state and an amorphous state;
a set of phase change material electrodes ohmically coupled to the phase change material and positioned on opposing sides thereof; and
a set of electric field electrodes configured to apply an electric field across the phase change material during a cooling period following heating,
wherein the phase change material includes n-type or p-type semiconductor impurities, and
wherein the electric field is configured to redistribute the semiconductor impurities within the phase change material to form a rectified current path.

11. The system of claim 10, wherein the set of phase change material electrodes is different from the pair of electric field electrodes.

12. The system of claim 10, wherein the set of phase change material electrodes is the set of electric field electrodes.

13. The system of claim 10, wherein the electric field electrodes are spaced from the phase change material by a dielectric gap.

14. The system of claim 10, wherein the semiconductor impurities are selected from a group consisting of arsenic, phosphorous, boron, and gallium.

15. The system of claim 10, wherein the phase change material comprises a chalcogenide compound, and the semiconductor impurities are configured to facilitate multiple logical states within the phase change material by creating distinct regions of rectified current paths.

16. An apparatus for storing data, comprising:
- a substrate supporting a phase change material capable of existing in multiple states corresponding to data values; and
- a plurality of electrodes arranged to provide both heating to transition the phase change material between its states and to apply an electric field across the phase change material;
- wherein the plurality of electrodes include a set of phase change material electrodes and a set of electric field electrodes, where at least one of the sets is configured to apply the electric field during a cooling period of the phase change material to facilitate redistribution of n-type or p-type semiconductor impurities within the phase change material, forming a rectified current path that encodes multiple logical states.

17. The apparatus of claim 16, wherein the set phase change material electrodes includes a pair of phase change material electrodes, wherein the phase change material is heated by passing a current through the set of phase change material electrodes that are ohmically coupled to the phase change material, and wherein the pair of phase change material electrodes are positioned on opposing sides of the phase change material.

18. The apparatus of claim 16, wherein the set of phase change material electrodes is different from the set of electric field electrodes.

19. The apparatus of claim 16, wherein the set of phase change material electrodes is the set of electric field electrodes.

20. The apparatus of claim 16, wherein the semiconductor impurities include at least one of arsenic, phosphorous, boron, or gallium.

* * * * *